United States Patent
Lin et al.

(10) Patent No.: US 10,656,518 B2
(45) Date of Patent: May 19, 2020

(54) AUTOMATIC INLINE DETECTION AND WAFER DISPOSITION SYSTEM AND METHOD FOR AUTOMATIC INLINE DETECTION AND WAFER DISPOSITION

(71) Applicant: UNITED MICROELECTRONICS CORP., Hsin-Chu (TW)

(72) Inventors: Ching-Pei Lin, Hsinchu County (TW); Chuang-Tse Wang, Hsinchu (TW); Fa-Fu Hu, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 123 days.

(21) Appl. No.: 15/844,617

(22) Filed: Dec. 17, 2017

(65) Prior Publication Data
US 2019/0187555 A1 Jun. 20, 2019

(51) Int. Cl.
| | |
|---|---|
| *G03F 1/84* | (2012.01) |
| *G06N 3/08* | (2006.01) |
| *G06N 3/04* | (2006.01) |
| *G03F 7/20* | (2006.01) |
| *H01L 21/66* | (2006.01) |
| *H01L 21/67* | (2006.01) |
| *H01L 21/027* | (2006.01) |

(52) U.S. Cl.
CPC .............. *G03F 1/84* (2013.01); *G03F 7/20* (2013.01); *G03F 7/705* (2013.01); *G03F 7/7065* (2013.01); *G03F 7/70491* (2013.01); *G03F 7/70508* (2013.01); *G03F 7/70533* (2013.01); *G06N 3/04* (2013.01); *G06N 3/08* (2013.01); *H01L 21/0274* (2013.01); *H01L 21/67259* (2013.01); *H01L 22/12* (2013.01); *H01L 22/20* (2013.01); *H01L 21/67288* (2013.01)

(58) Field of Classification Search
CPC . G03F 1/84; G03F 7/70; G06T 7/0002; G06T 7/0004; G06T 7/0006; G01N 21/9501
USPC .......................................................... 716/51
See application file for complete search history.

(56) References Cited

U.S. PATENT DOCUMENTS

| | | | |
|---|---|---|---|
| 6,091,846 A | 7/2000 | Lin | |
| 2004/0078108 A1* | 4/2004 | Choo | G01N 21/4738 700/121 |
| 2014/0240486 A1* | 8/2014 | Okada | H01L 21/67288 348/87 |
| 2017/0140524 A1 | 5/2017 | Karsenti | |

(Continued)

*Primary Examiner* — Paul Dinh
(74) *Attorney, Agent, or Firm* — Winston Hsu

(57) ABSTRACT

A method for automatic inline detection and wafer disposition includes the following steps. An exposure process is performed to wafers in an exposure apparatus. A virtual inspection is performed based on log files of the exposure process. A wafer automatic disposition is performed according to a result of the virtual inspection. An automatic inline detection and wafer disposition system includes a first computer system coupled to an exposure apparatus and a second computer system coupled to the first computer system. The exposure apparatus is configured to perform an exposure process to wafers, and the first computer system is configured to perform a virtual inspection based on log files of the exposure process. The second computer system is configured to receive a result of the virtual inspection and perform a wafer automatic disposition according to the result of the virtual inspection.

14 Claims, 5 Drawing Sheets

(56) References Cited

U.S. PATENT DOCUMENTS

| | | |
|---|---|---|
| 2017/0192411 A1 | 7/2017 | Ghadar |
| 2017/0193680 A1* | 7/2017 | Zhang ................ G01N 21/9501 |
| 2017/0194126 A1 | 7/2017 | Bhaskar |
| 2017/0200265 A1* | 7/2017 | Bhaskar ................ G06T 7/0006 |
| 2018/0204315 A1* | 7/2018 | Plihal ........................ G06T 7/70 |

\* cited by examiner

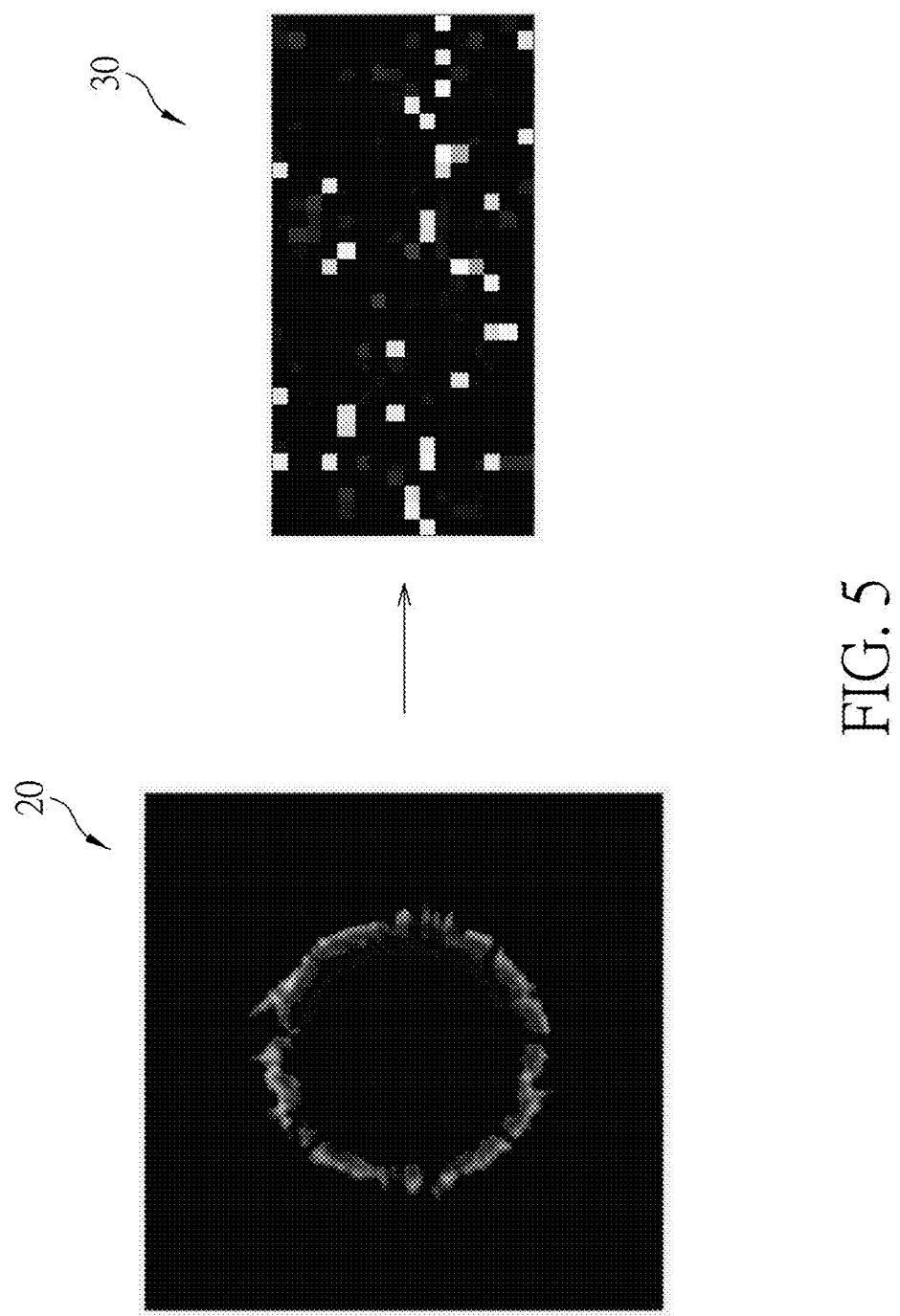

AUTOMATIC INLINE DETECTION AND WAFER DISPOSITION SYSTEM AND METHOD FOR AUTOMATIC INLINE DETECTION AND WAFER DISPOSITION

BACKGROUND OF THE INVENTION

1. Field of the Invention

The present invention relates to an automatic inline detection and wafer disposition system and a method for automatic inline detection and wafer disposition, and more particularly, to an automatic inline detection and wafer disposition system and a method for automatic inline detection and wafer disposition employing a virtual inspection.

2. Description of the Prior Art

Semiconductor integrated circuits undergo a variety of processing steps during manufacture, such as deposition, resist coating, exposure, developing, and etching, and. In many of these steps, material is overlaid or removed from the existing layer at specific locations in order to form the desired elements of the integrated circuit. Manufacturing defects such as particles and abnormal thickness distribution of material films or photoresist will directly influence the manufacturing yield and have to be monitored. However, wafers have to be transmitted to inspection tools such as automatic optical inspection (AOI) systems for defect detecting and ellipsometers for thickness monitoring after specific manufacturing processes, and it takes the time to complete the inspection before the next manufacturing step. In addition, the wafers have to be held until the inspection result is reviewed by related engineers when the inspection result is abnormal, and the engineers have to analyze the defects and decide the disposition of the wafers. Therefore, the total manufacturing time will increase, and the throughput cannot be enhanced accordingly. For improving the throughput, sampling inspection may be applied after some manufacturing processes. However, the defect detection rate will become lowered by the sampling inspection, and the manufacturing yield will be influenced accordingly.

SUMMARY OF THE INVENTION

An automatic inline detection and wafer disposition system and a method for automatic inline detection and wafer disposition are provided by the present invention. In the method for automatic inline detection and wafer disposition, a virtual inspection is performed based on log files of an exposure process performed to wafers, and a wafer automatic disposition is performed according to a result of the virtual inspection. The inspection may be completed virtually without using other inspection tools, and the wafers may be disposed automatically according to the result of the virtual inspection for enhancing the throughput and reducing the required manpower. Additionally, all of the wafers passing through the exposure process may be inspected by the virtual inspection for enhancing the defect detection rate and improving the manufacturing yield.

According to an embodiment of the present invention, a method for automatic inline detection and wafer disposition is provided. The method includes the following steps. An exposure process is performed to wafers in an exposure apparatus. A virtual inspection is performed based on log files of the exposure process. A wafer automatic disposition is performed according to a result of the virtual inspection.

According to an embodiment of the present invention, an automatic inline detection and wafer disposition system is provided. The automatic inline detection and wafer disposition system includes a first computer system coupled to an exposure apparatus and a second computer system coupled to the first computer system. The exposure apparatus is configured to perform an exposure process to wafers, and the first computer system is configured to perform a virtual inspection based on log files of the exposure process. The second computer system is configured to receive a result of the virtual inspection and perform a wafer automatic disposition according to the result of the virtual inspection.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 and FIG. 5 are schematic drawings illustrating the virtual inspection according to an embodiment of the present invention, wherein FIG. 5 is a schematic drawing in a step subsequent to FIG. 4.

DETAILED DESCRIPTION

Figure 1:
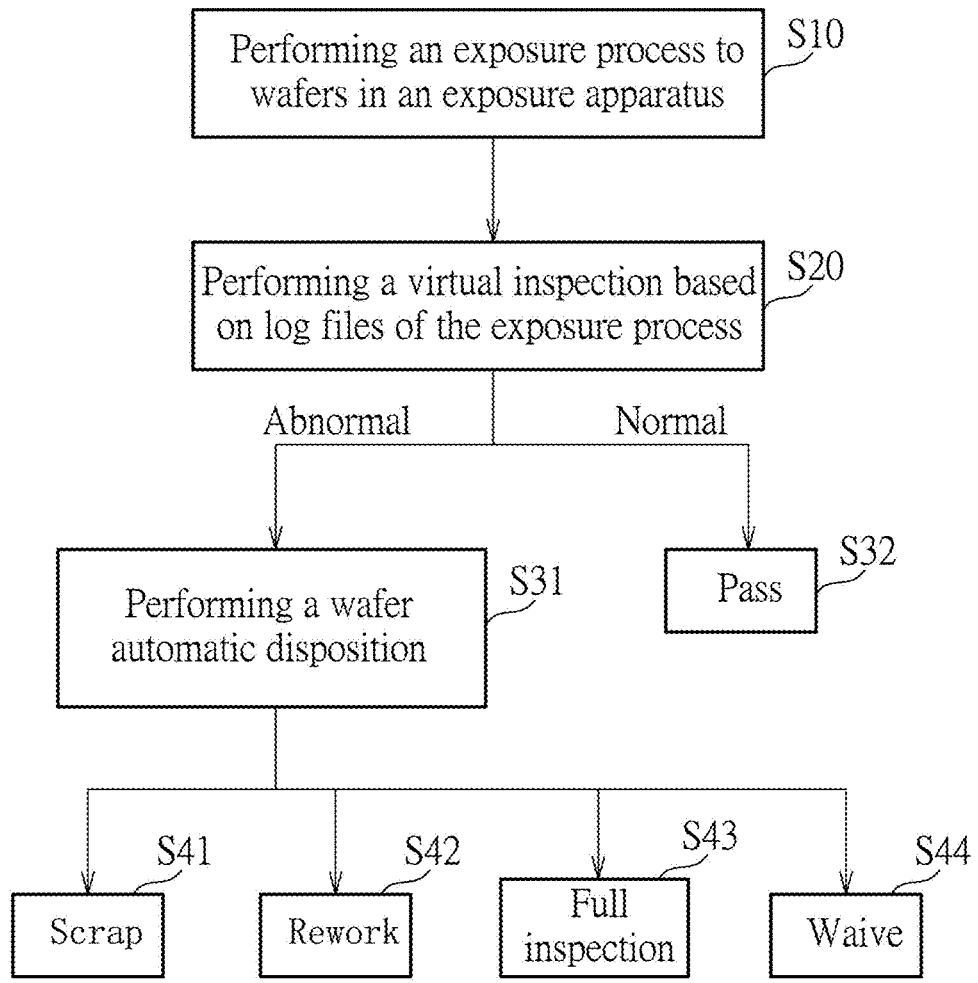
FIG. 1 is a flow chart of a method for automatic inline detection and wafer disposition according to an embodiment of the present invention.
Figure 2:
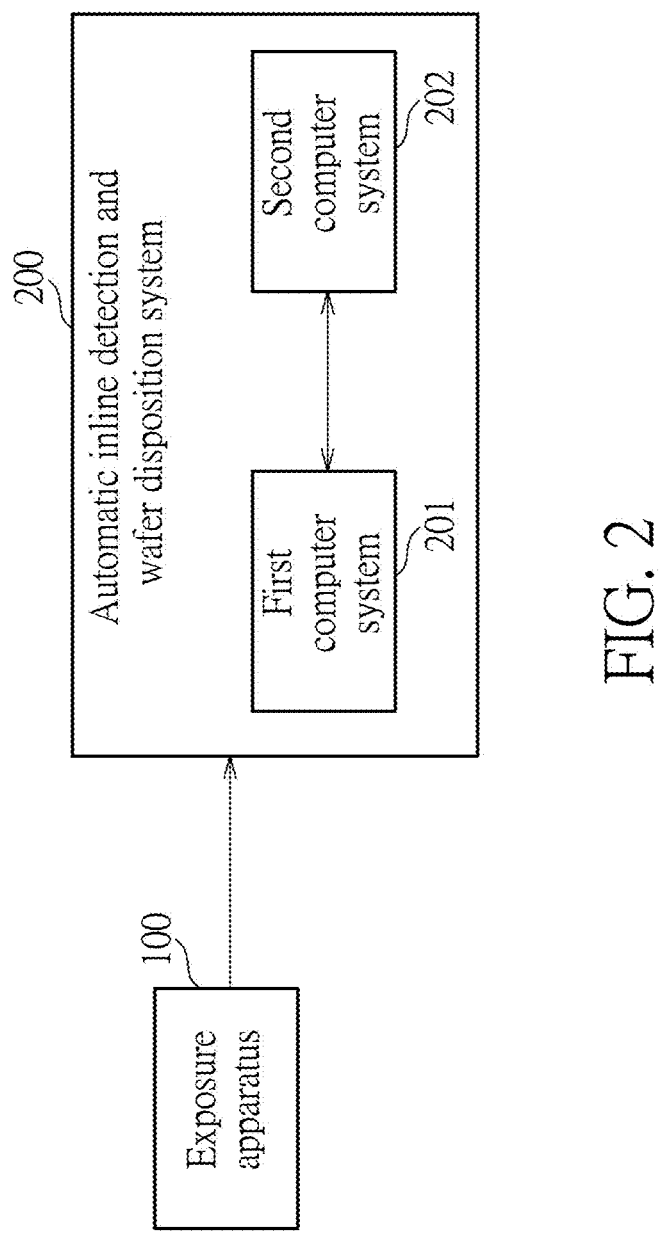
FIG. 2 is a schematic drawing illustrating an automatic inline detection and wafer disposition system according to an embodiment of the present invention.

Please refer to FIG. 1 and FIG. 2. FIG. 1 is a flow chart of a method for automatic inline detection and wafer disposition according to an embodiment of the present invention, and FIG. 2 is a schematic drawing illustrating an automatic inline detection and wafer disposition system in this embodiment. As shown in FIG. 1, a method for automatic inline detection and wafer disposition is provided. The method includes the following steps. In step S10, an exposure process is performed to wafers in an exposure apparatus. In some embodiments, the exposure process may include a photolithography exposure process, and the exposure apparatus may include a photolithographic exposure apparatus, such as a scanner-type exposure, a stepper-type exposure, or other suitable types of exposure apparatus, but not limited thereto. In step S20, a virtual inspection is performed based on log files of the exposure process mentioned above. In some embodiments, the log files of the exposure process may include information about depths of focus of exposure shots in the exposure process, coordinate of each of the exposure shots in the exposure process, process time, process date, exposure recipe, and wafer ID (identification), but not limited thereto. If the result of the virtual inspection of one of the wafers is normal, step S32 is carried out to pass the wafer to the subsequent process, such as develop process for forming a patterned photoresist layer on the wafer, but not limited thereto. If the result of the virtual inspection of one of the wafers is abnormal, step S31 is carried out to perform a wafer automatic disposition according to the result of the virtual inspection. For example, after step S31, step S41 may be carried out to scrap the wafer, step S42 may be carried out to rework, step S43 may be carried out to perform a full inspection to the wafer, and step S44 may be carried out to waive the hold condition of the wafer and pass the wafer to the subsequent process. In other words, each of the wafers may be determined to be scraped, reworked, further inspected, or waived automatically by the wafer automatic disposition when the result of the virtual inspection of the wafer is abnormal.

As shown in FIG. 1 and FIG. 2, an automatic inline detection and wafer disposition system 200 is provided. The automatic inline detection and wafer disposition system 200 includes a first computer system 201 coupled to an exposure apparatus 100 and a second computer system 202 coupled to the first computer system 201. The exposure apparatus 100 is configured to perform the above-mentioned exposure process to the wafers, and the first computer system 201 is configured to perform the above-mentioned virtual inspection based on the log files of the exposure process. The second computer system 202 is configured to receive the result of the virtual inspection and perform the above-mentioned wafer automatic disposition according to the result of the virtual inspection. Each of the wafers may be determined to be scraped, reworked, further inspected, or waived automatically by the wafer automatic disposition executed by the second computer system 202. Additionally, other disposition rules such as disposition rules related to the process layer, the defect count, the defect size, and/or the defect area may also be applied by the second computer system 202 for disposing the wafers automatically.

In some embodiments, the exposure apparatus 100 may include a photolithographic exposure apparatus, and the exposure process may include a photolithography exposure process, but not limited thereto. In some embodiments, the first computer system 201 and the second computer system 202 may take various forms, including a personal computer system, a mainframe computer system, a workstation, a network appliance, or other suitable computer devices. The term "computer system" may be defined to encompass any device having one or more processors, which executes instructions from a memory medium. In some embodiments, the first computer system 201 and the second computer system 202 may be two computer systems coupled with each other. Therefore, the above-mentioned wafer automatic disposition maybe performed by a computer system coupled to another computer system configured to perform the above-mentioned virtual inspection. However, in some embodiments, the first computer system 201 and the second computer system 202 may also be regarded as one integrated computer system configured to perform the virtual inspection and the wafer automatic disposition mentioned above. In some embodiments, the exposure apparatus 100 may also be regarded as apart of the automatic inline detection and wafer disposition system 200.

Figure 3:
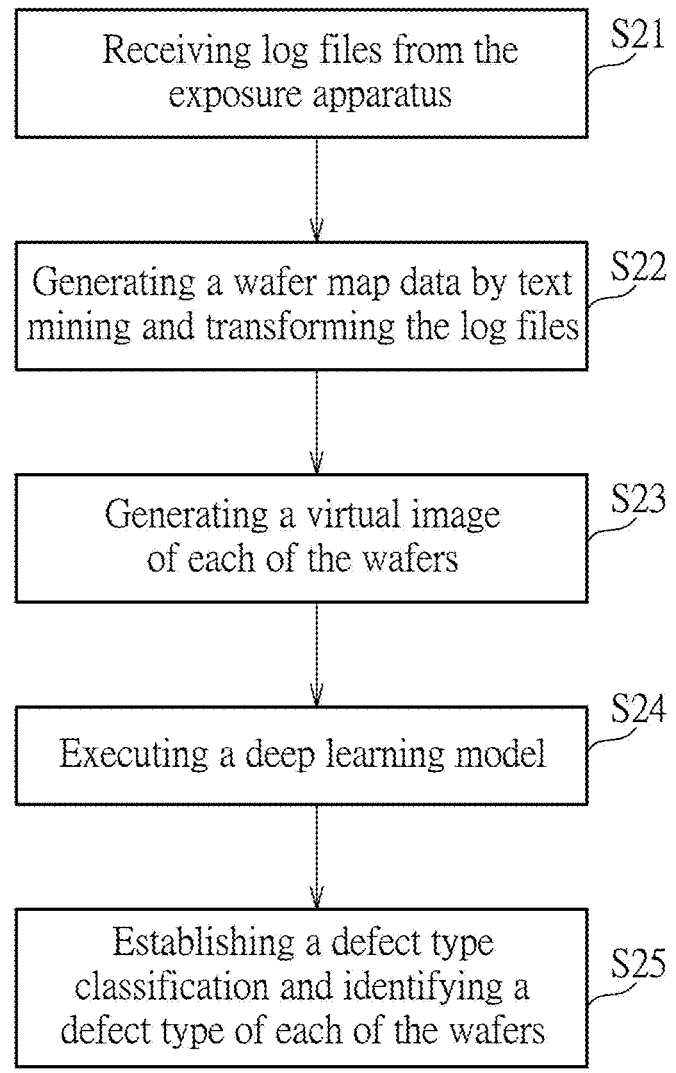
FIG. 3 is a flow chart of a virtual inspection according to an embodiment of the present invention.

Please refer to FIGS. 1-3. FIG. 3 is a flow chart of a virtual inspection according to an embodiment of the present invention. As shown in FIGS. 1-3, in some embodiments, the above-mentioned virtual inspection may include but is not limited to the following steps. In step S21, the log files of the wafers from the exposure apparatus 100 are received. In some embodiments, the log files of the wafers from the exposure apparatus 100 may be received by the first computer system 201. In step S22, a wafer map data may be generated by text mining and transforming the log files from the exposure apparatus 100. In some embodiments, the wafer map data may include a depth of focus distribution of the exposure shots in the exposure process performed to the wafers. For example, the wafer map data may include data about depths of focus presented by an equation listed below.

$$Z = aX^2 + bXY + cY^2 + d$$

In the above equation, X stands for an x-coordinate of one exposure shot, Y stands for a y-coordinate of the exposure shot, Z stands for a depth of focus of the exposure shot, and a, b, c, and d are constants which may be calculated by the first computer system 201. In other words, the wafer map data may be the depth of focus distribution of the exposure shots within one wafer, and the wafer map data may be used as a reference where the depth of focus distribution is relatively normal. It is worth noting that the wafer map data is not limited to the depth of focus distribution mentioned above. In some embodiments, the wafer map data may also be generated by other information from the log files of the exposure process, such as a variation between the actual coordinates of each exposure shot and the design coordinates of each exposure shot, but not limited thereto.

Subsequently, in step S23, a virtual image of each of the wafers may be generated. In some embodiments, the virtual image of each of the wafers may be generated by depth of focus variations between the wafer map data and the wafer. For example, a virtual image 10 shown in FIG. 4 may be generated by depth of focus variations between the wafer map data and one specific wafer, and the variations may be converted into dots with different colors and/or different gray scales in the virtual image 10. In other words, the dots with different colors and/or different gray scales in the virtual image 10 represent different variations in the depth of focus. In some embodiments, the depth of focus of specific exposure shot of one of the wafers may be different from that of another one of the wafers because autofocus may be performed before each of the exposure shots and the depth of focus may be different between the wafers when the thickness of a material layer on one of the wafers and/or the defect condition of the wafer is different from that of another one of the wafers. Accordingly, the distribution of the depth of focus and/or the distribution of the depth of focus variations may be used to inspect defects of the wafers. In some embodiments, the virtual image of each of the wafers may also be generated by other kinds of variations between the wafer map data and one specific wafer, such as coordinate variations, but not limited thereto.

Subsequently, in step S24, a deep learning model may be executed to the virtual images mentioned above. In step S25, a defect type classification may be established and a defect type of each of the wafers may be identified by the deep learning model. In some embodiments, the deep learning model comprises a convolutional neural network (CNN), and the CNN may be executed by a software library for numerical computation using data flow graphs, such as TensorFlow, but not limited thereto. In some embodiments, other kinds of deep learning models may also be applied for establishing the defect type classification and identifying the defect type of each of the wafers, and the deep learning model may be executed by other suitable software. In step S25, the virtual image of one of the wafer may be input into the CNN for identifying the defect type of the wafer.

Figure 4:
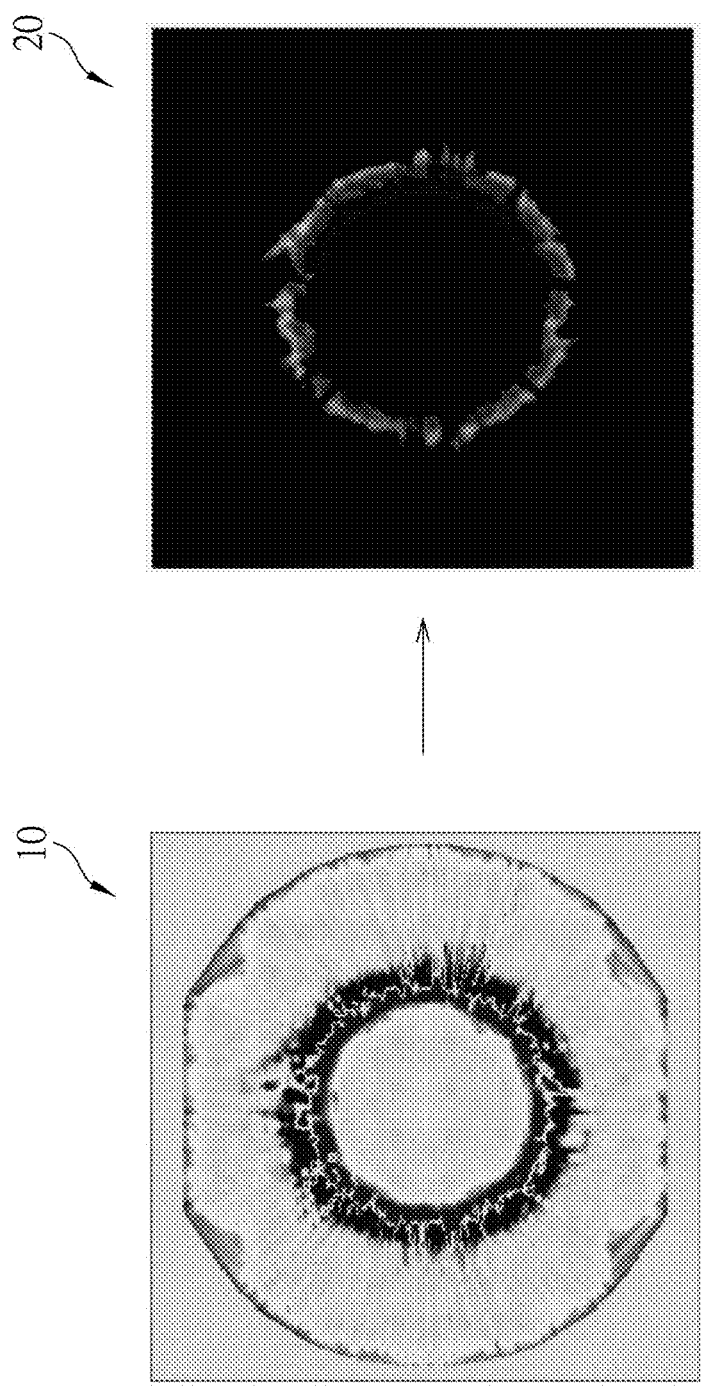

Please refer to FIGS. 3-5. FIG. 4 and FIG. 5 are schematic drawings illustrating the virtual inspection according to an embodiment of the present invention. Specifically, FIG. 4 and FIG. 5 may be regarded as schematic drawings illustrating the convolutional neural network performed in the virtual inspection of the present invention. The convolutional neural network which is generally applied to analyze visual imagery may be applied to analyze the virtual images mentioned above. A convolutional neural network generally consists of an input and an output layer, as well as multiple hidden layers. The hidden layers of a convolutional neural network typically consist of convolutional layers, pooling layers, rectified linear unit (RELU) layers, fully connected layers, and normalization layers. Convolutional layers apply a convolution operation to the input, passing the result to the next layer. The convolution emulates the response of an individual neuron to visual stimuli. Convolutional networks may include local or global pooling layers, which combine the outputs of neuron clusters at one layer into a single neuron in the next layer. For example, max pooling uses the maximum value from each of a cluster of neurons at the prior layer, and average pooling uses the average value from each of a cluster of neurons at the prior layer. RELU layers may be used to increase the nonlinear properties of the decision function and of the overall network without affecting the receptive fields of the convolution layers. Fully connected layers connect every neuron in one layer to every neuron in another layer. Accordingly, in a convolutional neural network model training flow, the virtual images mentioned may be loaded, and steps such as convolution, RELU, pooling, flattening, and full connection may be performed. In the flattening operation, it gets the output of the convolutional layers, flattens all its structure to create a single long feature vector to be used by the dense layer for the final classification. For example, as shown in FIGS. 3-5, a first feature image 20 may be obtained by performing the convolution step and the RELU step to the virtual image 10, and a second feature image 30 may be obtained by performing the flattening step and the full connection step. The steps mentioned above may be performed repeatedly for increasing the accuracy and establishing the model of the defect type classification. The model may be used to identify the defect type of each of the wafers when an accuracy threshold (such as 95%) is met in the convolutional neural network model training flow.

To summarize the above descriptions, in the automatic inline detection and wafer disposition system and the method for automatic inline detection and wafer disposition according to the present invention, the virtual inspection is performed based on the log files of the exposure process performed to the wafers, and the wafer automatic disposition is performed according to the result of the virtual inspection. Therefore, the inspection may be completed virtually without using the conventional inspection tools, and the wafers may be disposed automatically according to the result of the virtual inspection for enhancing the throughput and reducing the required manpower. Additionally, all of the wafers passing through the exposure process may be inspected by the virtual inspection of the present invention, and the defect detection rate and the manufacturing yield may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for automatic inline detection and wafer disposition, comprising:
    performing an exposure process to wafers in an exposure apparatus, wherein the exposure process comprises a photolithography exposure process;
    performing a virtual inspection based on log files of the exposure process by a first computer system;
    performing a wafer automatic disposition when a result of the virtual inspection is abnormal by a second computer system coupled to the first computer system; and
    performing a develop process for forming a patterned photoresist layer on the wafer when the result of the virtual inspection is normal, wherein the virtual inspection comprises:
        receiving the log files from the exposure apparatus;
        generating a wafer map data by text mining and transforming the log files;
        generating a virtual image of each of the wafers;
        executing a deep learning model to the virtual images; and
        establishing a defect type classification and identifying a defect type of each of the wafers by the deep learning model.

2. The method of claim 1, wherein the log files of the exposure process comprise information about depths of focus of exposure shots in the exposure process.

3. The method of claim 1, wherein the wafer map data comprises a depth of focus distribution of exposure shots in the exposure process performed to the wafers.

4. The method of claim 3, wherein the virtual image of each of the wafers is generated by depth of focus variations between the wafer map data and the wafer.

5. The method of claim 1, wherein the deep learning model comprises a convolutional neural network (CNN).

6. The method of claim 5, wherein the CNN is executed by a software library for numerical computation using data flow graphs.

7. The method of claim 5, wherein the virtual image of one of the wafer is input into the CNN for identifying the defect type of the wafer.

8. The method of claim 1, wherein each of the wafers is determined to be scraped, reworked, further inspected, or waived automatically by the wafer automatic disposition.

9. An automatic inline detection and wafer disposition system, comprising:
    a first computer system coupled to an exposure apparatus, wherein the exposure apparatus is configured to perform an exposure process to wafers, and the first computer system is configured to perform a virtual inspection based on log files of the exposure process, wherein the exposure process comprises a photolithography exposure process; and
    a second computer system coupled to the first computer system, wherein the second computer system is configured to receive a result of the virtual inspection and perform a wafer automatic disposition when the result of the virtual inspection is abnormal, and a develop process is performed for forming a patterned photoresist layer on the wafer when the result of the virtual inspection is normal, wherein the virtual inspection comprises:
        receiving the log files from the exposure apparatus;
        generating a wafer map data by text mining and transforming the log files;
        generating a virtual image of each of the wafers;
        executing a deep learning model to the virtual images; and
        establishing a defect type classification and identifying a defect type of each of the wafers by the deep learning model.

10. The automatic inline detection and wafer disposition system of claim 9, wherein the log files of the exposure process comprise information about depths of focus of exposure shots in the exposure process.

11. The automatic inline detection and wafer disposition system of claim 9, wherein the wafer map data comprises a depth of focus distribution of exposure shots in the exposure process performed to the wafers.

12. The automatic inline detection and wafer disposition system of claim 9, wherein the virtual image of each of the wafers is generated by depth of focus variations between the wafer map data and the wafer.

13. The automatic inline detection and wafer disposition system of claim 9, wherein the deep learning model comprises a convolutional neural network (CNN).

14. The automatic inline detection and wafer disposition system of claim 9, wherein each of the wafers is determined to be scraped, reworked, further inspected, or waived automatically by the wafer automatic disposition.

* * * * *